(12) United States Patent
Ben Dhiab et al.

(10) Patent No.: US 11,934,580 B2
(45) Date of Patent: Mar. 19, 2024

(54) TOUCH INTERFACE OFFERING IMPROVED LOCALISED VIBROTACTILE FEEDBACK (71) Applicant: COMMISSARIAT A L'ENERGIE ATOMIQUE ET AUX ENERGIES ALTERNATIVES, Paris (FR)

(72) Inventors: Ayoub Ben Dhiab, Paris (FR); Charles Hudin, Paris (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 159 days.

(21) Appl. No.: 17/608,801

(22) PCT Filed: May 7, 2020

(86) PCT No.: PCT/EP2020/062728
§ 371 (c)(1),
(2) Date: Nov. 4, 2021

(87) PCT Pub. No.: WO2020/225370
PCT Pub. Date: Nov. 12, 2020

(65) Prior Publication Data
US 2022/0283639 A1  Sep. 8, 2022

(30) Foreign Application Priority Data

May 7, 2019 (FR) ........................................ 1904756

(51) Int. Cl.
*G06F 3/01* (2006.01)
*G06F 3/044* (2006.01)
*H10N 30/20* (2023.01)
(52) U.S. Cl.
CPC ............ *G06F 3/016* (2013.01); *G06F 3/0445* (2019.05); *H10N 30/20* (2023.02)

(58) Field of Classification Search
CPC ........ G06F 3/016; G06F 3/0445; G06F 3/044; H10N 30/20
See application file for complete search history.

(56) References Cited

U.S. PATENT DOCUMENTS 10,331,216 B1 *  6/2019  Khoshkava ............. G06F 3/044
10,775,889 B1 *  9/2020  Lehmann .................. G01L 1/16
(Continued)

FOREIGN PATENT DOCUMENTS

FR          3 042 289 A1    4/2017
GB          2464117 A       4/2010
(Continued)

OTHER PUBLICATIONS

U.S. Appl. No. 16/955,983, filed Jun. 19, 2020, Charles Hudin.
(Continued)

*Primary Examiner* — William Lu
(74) *Attorney, Agent, or Firm* — Oblon, McClelland, Maier & Neustadt, L.L.P.

(57) ABSTRACT

The invention relates to a haptic interface comprising a substrate (2), a plate (4) comprising a surface (6) for interaction with one or more fingers of a user, and actuators (A1) capable of applying a vibration to said plate (4), and a control module (MC) for controlling said actuator,—said plate (4) being in the shape of a strip extending along a first direction (X) and delimited transversely to the first direction by two lateral edges (10), said lateral edges (10) being supported by said substrate (6),—said control module (MC) being configured to generate control signals to said actuator (A1) at first frequencies lower than the cut-off frequency of the first propagation mode of said plate, so that the actuator (A1) generates evanescent waves in the plate (4).

16 Claims, 6 Drawing Sheets

(56) References Cited

U.S. PATENT DOCUMENTS

| | | | |
|---|---|---|---|
| 10,809,806 B2* | 10/2020 | Harris | G06F 3/016 |
| 10,827,620 B2* | 11/2020 | Lin | G06F 1/16 |
| 10,838,498 B2* | 11/2020 | Nakano | H10N 30/206 |
| 10,866,665 B2* | 12/2020 | Boggs | B32B 17/06 |
| 11,137,900 B2 | 10/2021 | Hudin | |
| 2009/0160763 A1* | 6/2009 | Cauwels | G06F 3/016 |
| | | | 345/156 |
| 2011/0037539 A1* | 2/2011 | Jansman | H03H 9/175 |
| | | | 29/25.35 |
| 2011/0090167 A1 | 4/2011 | Harris | |
| 2011/0102349 A1* | 5/2011 | Harris | G06F 3/038 |
| | | | 345/173 |
| 2012/0038568 A1* | 2/2012 | Colloms | G06F 3/016 |
| | | | 345/173 |
| 2012/0056838 A1* | 3/2012 | Harris | G06F 3/016 |
| | | | 345/173 |
| 2013/0318438 A1 | 11/2013 | Afshar | |
| 2014/0111288 A1* | 4/2014 | Nikkel | H03H 9/02157 |
| | | | 333/187 |
| 2014/0225683 A1* | 8/2014 | Burak | H03H 9/173 |
| | | | 333/187 |
| 2014/0253305 A1* | 9/2014 | Rosenberg | G01L 1/22 |
| | | | 345/174 |
| 2014/0375602 A1 | 12/2014 | Fujiune | |
| 2015/0016777 A1* | 1/2015 | Abovitz | G02B 27/0093 |
| | | | 385/37 |
| 2015/0277565 A1 | 10/2015 | Harris | |
| 2016/0349846 A1* | 12/2016 | Sugiura | G06F 3/016 |
| 2017/0228022 A1* | 8/2017 | Shimanouchi | G06F 3/041 |
| 2017/0329408 A1 | 11/2017 | Harris | |
| 2017/0357325 A1* | 12/2017 | Yang | G06F 3/0443 |
| 2018/0275810 A1* | 9/2018 | Khoshkava | G06F 3/0488 |
| 2018/0364805 A1 | 12/2018 | El-Ouardi et al. | |
| 2020/0050356 A1 | 2/2020 | Hudin | |
| 2020/0083860 A1* | 3/2020 | Ylilammi | H03H 9/02015 |
| 2020/0083862 A1* | 3/2020 | Makkonen | H03H 9/547 |
| 2020/0150767 A1* | 5/2020 | Karimi Eskandary | |
| | | | H04M 1/0202 |
| 2021/0075392 A1* | 3/2021 | Makkonen | H03H 9/605 |
| 2022/0261081 A1* | 8/2022 | Casset | G06F 3/0412 |

FOREIGN PATENT DOCUMENTS

| | | | | |
|---|---|---|---|---|
| WO | WO-2017106526 A1 * | 6/2017 | | H01L 41/09 |
| WO | WO 2018/178582 A1 | 10/2018 | | |

OTHER PUBLICATIONS

International Search Report dated Aug. 20, 2020 in PCT/EP2020/062728 filed on May 7, 2020 (3 pages).

Preliminary French Search Report dated Feb. 25, 2020 in French Application No. 1904756 filed on May 7, 2019 (2 pages; with Translation of Category).

Hudin et al., "Localized Tactile Feedback on a Transparent Surface through Time-Reversal Wave Focusing", IEEE Transactions on Haptics, vol. 8, No. 2, Apr. 1, 2015, pp. 188-198, 11 total pages.

Hudin, "Local friction modulation using non-radiating ultrasonic vibrations", 2017 IEEE World Haptics Conference (WHC), Fürstenfeldbruck (Munich), Germany, Jun. 6-9, 2017, pp. 19-24.

* cited by examiner

TOUCH INTERFACE OFFERING IMPROVED LOCALISED VIBROTACTILE FEEDBACK

TECHNICAL FIELD AND PRIOR ART

The present invention relates to a touch interface offering improved localised vibrotactile feedback.

Touch interfaces with vibrotactile feedback are used for human-machine interactions. The touch interfaces are implemented in many technical fields, they are used for example in motor vehicles and equip for example the dashboards and/or central consoles and computer hardware, such as a computer mice, computer keyboards, etc.

Touch interfaces with vibrotactile feedback include a surface and one or several actuator(s) which generate(s) vibrations through the surface to transmit information to a user, for example through one or more of his/her fingers in contact with the surface. When the vibrations are correlated with the movements of the finger and with the force applied by the finger, the interface could simulate a click, a boss, a texture.

The user may have several fingers in contact with the surface while desiring to stimulate only one finger or stimulate the fingers differently to transmit different information thereto. This interface type is called multicontact or multitouch interface.

Furthermore, there are interfaces intended to be simultaneously used by several users, to whom it is desired to transmit different pieces of information by generating different vibrations.

Yet, the propagation of the waves and the reverberation effects generally lead to a uniform distribution of the vibratory energy over the entire surface. The actuators, acting as local sources of vibrations, produce an overall and uniform stimulation. It is then possible to provide a different vibrotactile feedback at different positions only for the exploration of one finger through a time variation correlated with the position of the finger.

The entire contact area being subjected to the same vibration, it is not possible, for static fingers, to generate variations at a scale smaller than the size of the fingers.

It is neither possible to provide a distinct retroaction to several fingers and/or to several users.

There is a touch interface implementing non-radiating frequencies that allows modulating the friction coefficient between the finger and the surface of the interface in a localised manner. However, this involves a movement of the finger. Furthermore, non-radiating frequencies are ultrasonic frequencies while the frequencies offering sensitivity to the touch are low frequencies, in general lower than a few kilohertz. Consequently, this touch interface is not suited for the generation of localised vibrotactile feedbacks.

There are also haptic interfaces implementing techniques for localising the vibrations, which shape the vibration field, such as time reversal, inverse filtering. They use signal processing and control strategies to create high amplitudes of vibrations at some positions and reduce them at others. These haptic interfaces offer a good-quality localised vibrotactile feedback. However, these techniques involve a processing of the signal which might be complex.

Hence, there is a need to provide a touch interface having a localised vibrotactile feedback comparable with the vibrotactile feedbacks generated by touch interfaces using for example time reversal yet implementing a simplified signal processing.

DISCLOSURE OF THE INVENTION

Consequently, the present invention aims to provide a touch interface offering localised vibrotactile feedback, with a relatively simple construction in comparison with the touch interfaces of the prior art.

The present invention also aims to provide a haptic interface enabling effective multitouch or multiuser interactions.

The goals set out hereinabove are achieved by a device including a support, at least one element having a first interaction surface, at least one first actuator configured so as to apply a vibration to said element. The support mechanically supports the element so as to delimit a strip in a first direction. The module also includes a control module of said actuator, configured to send control signals with the instructions at a frequency lower than the cutoff frequency of the first propagation mode of the element.

The inventors have determined that an elongate-shaped interaction surface mechanically supported at its edges with the largest length has a propagation mode whose cutoff frequency is non-zero, which provided access to a range of non-propagating frequencies allowing generating a vibration whose propagation around the actuator is limited, by selecting in this range, a frequency for the control signals of the actuator(s).

The application of the invention to a haptic interface allows offering a localised vibrotactile feedback. Hence, the interface made in this manner can be used as a multitouch and/or multiuser interface.

Preferably, the length of the element is at least 2 to 3 times larger than its width.

For example, the element is simply supported and/or embedded at its lateral edges.

In one embodiment, the interface includes a plate in the form of a strip, its lateral edges being supported by the support.

In another example, the interface includes a plate and the support supports the plate so as to delimit parallel strips.

Thus, an object of the present invention is a haptic interface including a support, at least one plate comprising a first face forming a surface for interaction with at least one member of a user, and at least one actuator adapted to apply a vibration to said plate, and a control module of said actuator. Said support includes at least two support elements supporting the plate so as to delimit between the two support elements a strip extending substantially along a first direction, said actuator being located opposite to the plate with respect to the interaction surface. Said control module is configured to generate control signals to said actuator at first frequencies lower than the cutoff frequency of the first propagation mode of said plate, so that the actuator generates evanescent waves in the plate.

Preferably, the plate has a first dimension in the first direction and wherein the distance between the two support elements is at least twice smaller than the first dimension. For example, the plate has a second dimension in a direction orthogonal to the first direction between its lateral edges, and the support elements support the lateral edges, the first dimension being at least twice larger than the second dimension.

The plate may be simply supported by the support and/or embedded to the support.

In one embodiment, the plate is glued on the support.

According to an additional feature, the frequency(ies) of the control signals are comprised between 0 Hz and a few kHz.

The haptic interface may include at least two actuators distributed along the first direction.

In one embodiment, the support includes at least three support elements so as to delimit at least two strips in the plate in the first direction, and wherein at least one actuator is located opposite each strip.

According to an additional feature, the haptic interface includes detection means to detect the position of said at least one member and the control module is configured so as to generate the control signals while taking into account the signals emitted by the detection means.

According to another additional feature, the haptic interface includes measuring means to measure a force exerted by said at least one member on the interaction surface and the control module is configured so as to generate the control signals while taking into account the signals emitted by the measuring means.

The interface may include several actuators and the control module is configured to generate control signals for each actuator individually.

In one embodiment, the control module is configured so as to generate control signals combining the control signals at the first frequencies and control signals at second non-radiating frequencies.

According to an additional feature, the haptic interface includes a screen disposed beneath the plate opposite to the interaction surface, said at least one actuator being between the plate and the screen, said at least one actuator being a piezoelectric actuator including transparent thin films.

Alternatively, the screen is fastened to the plate opposite to the interaction surface, said screen being interposed between the plate and said at least one actuator.

Another object of the present invention is a computer keyboard including keys and at least one haptic interface according to the invention.

Another object of the present invention is a computer mouse including at least one haptic interface according to the invention, said haptic interface being configured to simulate at least one click.

BRIEF DESCRIPTION OF THE DRAWINGS

The present invention will be better understood based on the following description and on the appended drawings wherein.

DETAILED DISCLOSURE OF PARTICULAR EMBODIMENTS

In the following description, it is considered that the user interacts with the touch interface with his/her fingers. It should be understood that he/she could interact with other portions of his/her body.

Figure 1:
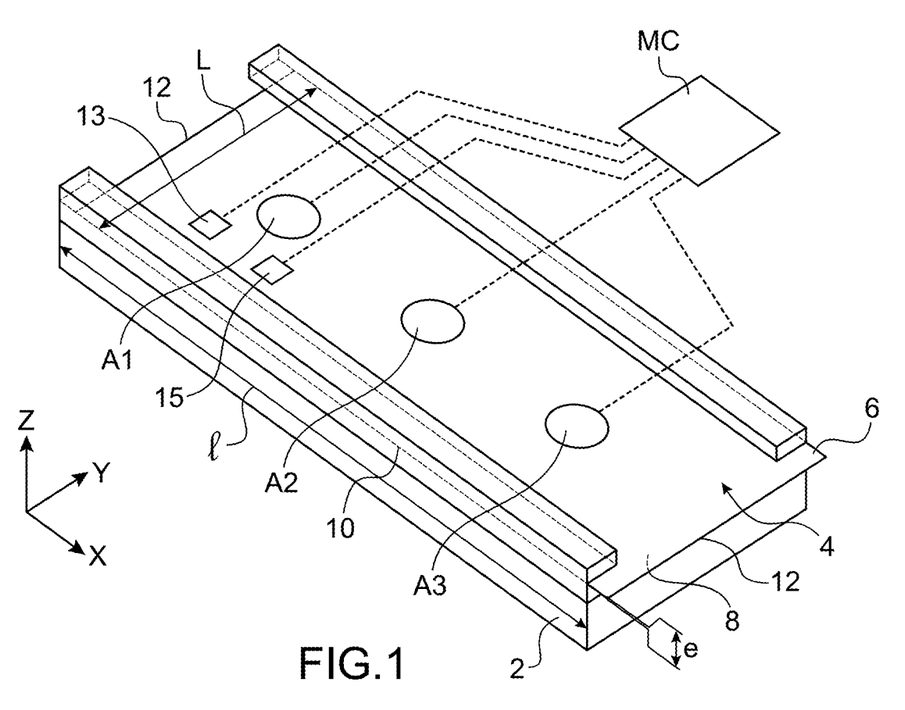
FIG. 1 is a perspective view of an embodiment of a haptic interface with vibrotactile feedback.

An embodiment of a haptic interface could be seen schematically represented in FIG. 1.

The haptic interface includes a support or frame 2 and an element or plate 4 mechanically supported by the frame 2.

The plate 4 includes a first face 6 with which the user is intended to interact, for example by positioning one or several finger(s) thereon. This first face is referred to as "touch surface".

The plate 4 includes a second face 8 opposite to the first face 6.

The plate includes lateral edges 10 in contact with the frame 2 and ends 12 connecting the lateral edges 10.

The first 6 and second 8 faces are separated by a distance e. The lateral edges 10 are separated by a distance W or width, and the ends 12 are separated by a distance L or length, the distance L being larger than the distance W.

The length L extends in the direction X, the width W extends in the direction Y and the thickness e extends in the direction Z.

The shape of the plate is selected so that the plate has the geometric properties of a waveguide. By "waveguide", it should be understood a medium where the propagation of the wave is limited in two directions of the space and free in the third direction. In the represented example, the direction of free propagation is the direction X.

For example, the length L of the plate is at least 2 times larger than its width, preferably at least 3 times larger than its width W.

In the example represented in FIG. 1, the plate 4 is rectangle shaped but this shape is not restrictive, any shape having a length larger than its width and its thickness falls within the scope of the present invention.

Figure 13A:
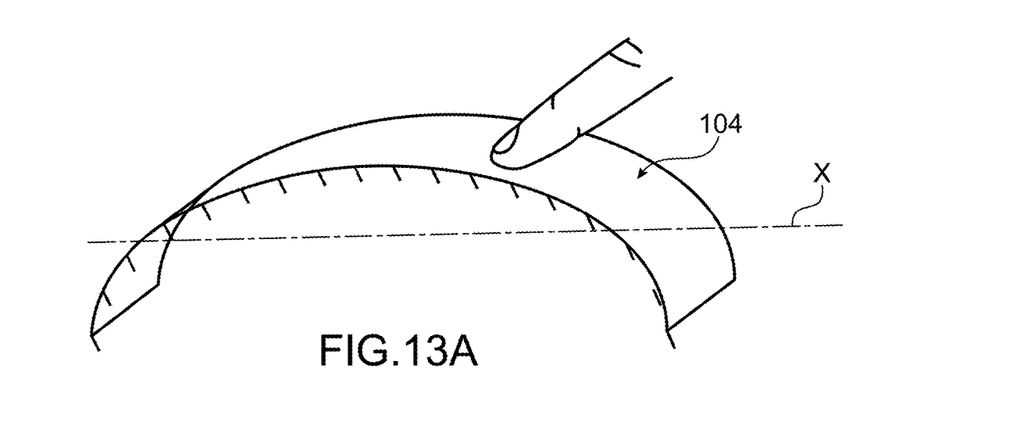
FIGS. 13A and 13B are schematic representations of other examples of haptic interfaces.
Figure 13B:
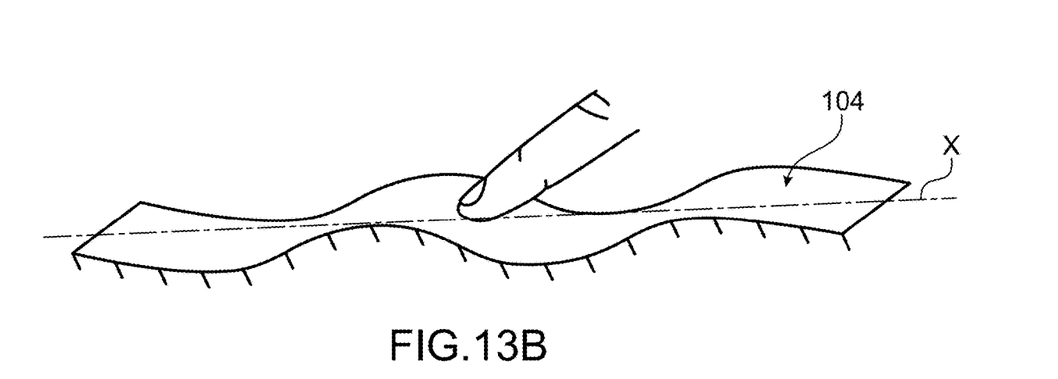

For example, examples of interfaces including plates 104 having a curved shapes could be seen in FIGS. 13A and 13B. The plate extends in the 3 dimensions. The frame is then adapted to the shape of the plate.

Furthermore, the strip may be corrugated in the plane. Thus, the strip is not rectilinear, nevertheless it extends substantially in the direction X.

The plate may be made of a unique material homogeneous and isotropic, or not. The material of the plate may be selected, for example, amongst metal, glass, plastic or a composite material. The plate may include an assembly of layers secured to one another. Alternatively, the plate includes a screen composed by a display, its backlight and its touch layer. Still alternatively, the plate includes a display with Organic Light-Emitting Diodes or OLED or of the epaper type, alone or superimposed to a rigid support.

The interface includes one or several actuator(s) A1, A2, A3, three in the represented example disposed beneath the plate and intended to come into contact with the second face 8 to apply a vibration thereto. The actuators are located beneath the plate 4 opposite the areas where it is desired to generate a vibrotactile stimulation. In the represented example, the actuators A1, A2, A3 are aligned along the X axis.

The actuators may be of different types, for example piezoelectric actuators, electromagnetic actuators, eccentric mass actuators or Linear Resonant Actuators or LRA.

These actuator types are well known in the field of haptic interfaces and will not be described in detail. Typically, the dimensions of the actuators are in the range of centimetres. Advantageously, it is possible to use piezoelectric actuators whose width is in the same range as that of the plate. A maximum density of actuators allowing actuating each point individually could be obtained by assembling the actuators contiguously.

Furthermore, the actuators may have sizes and shapes different from each other.

The plate 4 is mechanically supported by the frame 2. In the present application, by "mechanically supported", it should be understood "simply supported", "embedded" or "partially simply supported and partially embedded".

A plate simply supported at its lateral edges is a plate that rests by its lateral edges on the frame such that its lateral edges could bend without any hindrance.

As regards the ends 12 of the plate 4, these may be free or held on the frame.

In the example represented in FIG. 1, the lateral edges 10 are embedded.

Alternatively, the plate is glued on the frame, such a connection by gluing mechanically corresponds to a partially supported and partially embedded connection.

Figure 14:
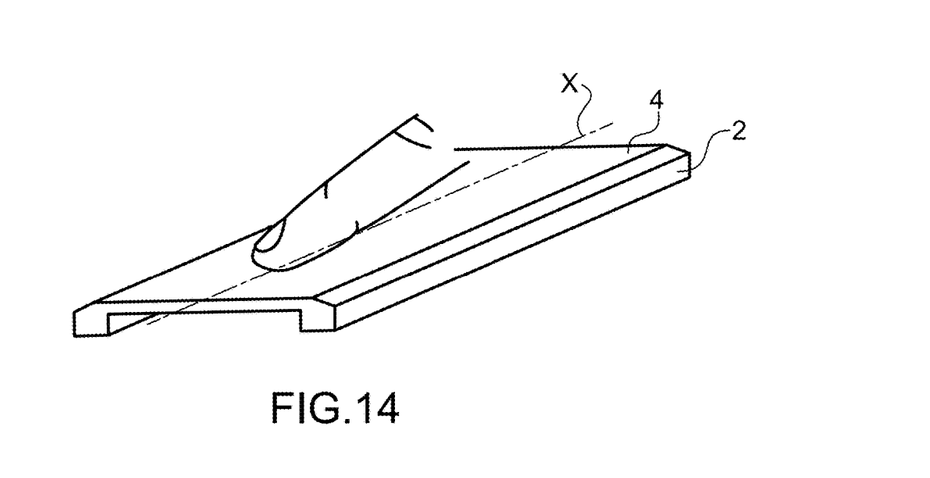
FIG. 14 is a schematic representation of an example of a haptic interface wherein the plate and the support are made in one-piece.

According to another variant represented in FIG. 14, the plate 4 and the frame are made in one-piece. The surface may be considered to be embedded in its support.

The interface also includes a control module M intended to generate control signals to each actuator so that these apply to the plate vibrations having determined characteristics. Preferably, the control module controls each actuator independently thereby allowing for a rich interaction.

The control signals are selected so as to have frequencies lower than the frequency of the first propagation mode of the plate supported by the frame.

We will explain how these frequencies are selected.

In the haptic interface of FIG. 1, the plate 4 forms a medium for the propagation of the vibratory waves which could be assimilated to a waveguide, i.e. having finite thickness and width but with an arbitrary length. The propagation of the waves in a waveguide could be described in terms of propagation modes. Each of these modes is defined by its profile, its wave speed and its cutoff frequency.

In the case of a simply supported or embedded plate, the zero mode has a zero amplitude and does not contribute to the propagation. Consequently, the bending waves cannot propagate in this guide below the cutoff frequency of the first propagation mode, while in most waveguides, the zero-order propagation mode, with a cutoff frequency equal to 0 Hz, exists.

The inventors have established the following expression relating the amplitude of the vibrations as a function of the frequency.

$$u(x,y,t) = (\Sigma_{n=1}^{\infty} A_n \sin(q_n y) e^{-jp_n x}) e^{j\omega t} \quad (1)$$

with:

$$q_n = \frac{n\pi}{W}$$

-continued $$p_n = \left(\frac{\rho h}{D}\right)^{\frac{1}{4}} \sqrt{\omega - \omega_n}$$

$$\omega_n = \sqrt{\frac{D}{\rho h}} \left(\frac{n\pi}{W}\right)^2$$

where:
$A_n$: the complex amplitude for each mode,
W: the width of the plate,
ρ: the volumetric mass,
h: the thickness of the plate,
D: the bending rigidity.

Figure 2:
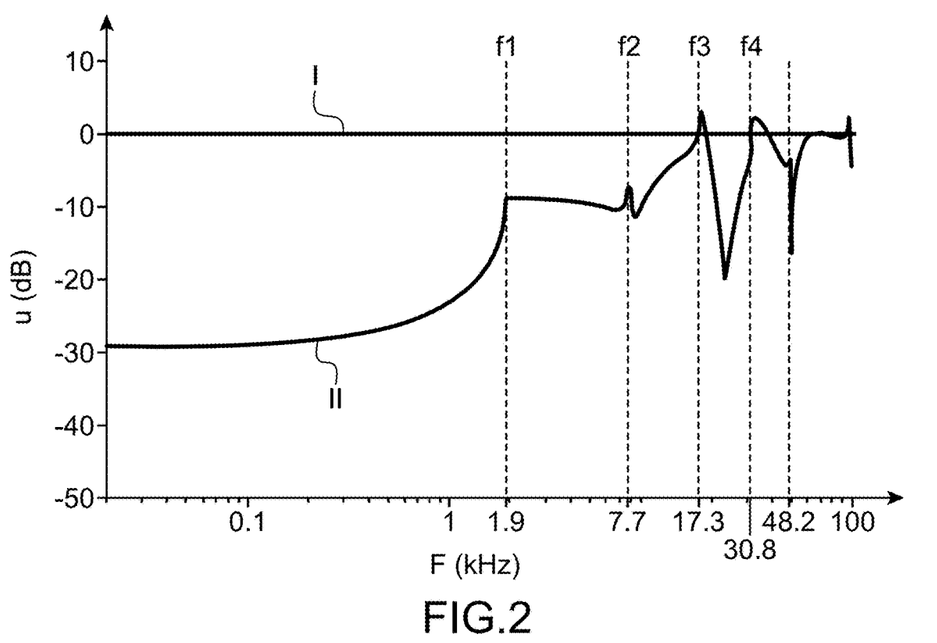
FIG. 2 is a graphical representation of the calculated movement in dB of the plate as a function of the frequency at the centre of the actuator (I) and at a point P remote from the centre of the actuator (II) for an example of a haptic interface including one actuator.

FIG. 2 represents the variation of the amplitude u of the vibrations in dB, calculated from formula (1), as a function of the frequency F in kHz at the centre of the actuator and at a point P remote from the actuator by a distance of 20 mm on the X axis and by a distance of W/6 on the Y axis, for a haptic interface having the following properties: the interface includes a plate with a width W=25 mm, with a thickness h=0.5 mm. It is made of aluminium, Poisson's coefficient ν=0.346, Young's modulus E=67 MPa, ρ=2700 kg/m², and an amplitude An=1. The interface includes an actuator.

The amplitude at the centre of the actuator is considered as reference and is represented by the curve I and the amplitude at the point P is represented by the curve II.

It is possible to observe the 1- to 4-order propagation modes and their respective cutoff frequencies f1, f2, f3, f4.

It is noticed that, for the frequency range between 0 Hz and f1, the amplitude of the vibratory waves decreases exponentially with the distance to the source, the waves generated at these frequencies therefore consist of evanescent waves, i.e. which do not propagate. Furthermore, f1=1.9 kHz. Yet, the frequencies at which the human being is sensitive to touch are comprised between 0 and 1 kHz. Hence, it is possible to select a frequency lower than f1 and at which the user will be sensitive by the touch, to generate control signals to the actuators, and generate vibrations that are detectable by the user localised at the actuators. Hence, a localised vibrotactile feedback is produced.

Hence, in the case of an interface with several actuators, it is possible to simultaneously offer vibrotactile feedbacks localised in the plate at different frequencies comprised within the interval [0 Hz; f1].

The cutoff frequency may reach 1 kHz which is the high limit of tactile sensitivity, or 10 kHz. Hence, the frequency(ies) of the control signals is/are comprised between 0 kHz and 10 kHz.

Figure 3:
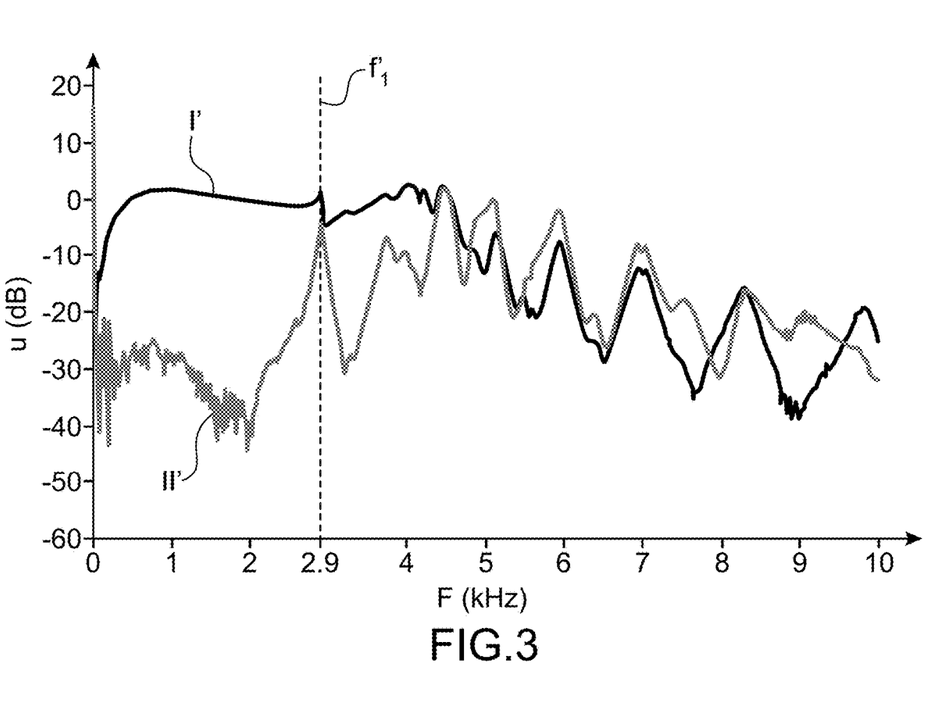
FIG. 3 is a graphical representation of the movement measured in dB of the plate as a function of the frequency at the centre of the actuator (I') and at a point P remote from the centre of the actuator (II') for another example of a haptic interface including one actuator.

In FIG. 3, one could see the variation of amplitude as a function of the frequency measured at the centre of the actuator and at the point P on a real haptic interface using a vibrometer in contact with the touch surface.

The haptic interface has the following features: it includes a plate made of aluminium with a piezoelectric actuator glued at the centre of the lower face. The actuator model muRata® 7BB-20-3, with a circular geometry, includes a plate with a 20 mm diameter and 0.1 mm thickness and an electrode with a 12.8 mm diameter and 0.11 mm thickness. The plate, measuring 25×200×0.5 mm³, is fastened on its longest sides to a rigid frame using an epoxy resin and left free at both ends. Movement off the plane of the surface is measured by a laser vibrometer model Polytec® OFV-534/2570.

The curve I' represents the amplitude in dB at the centre of the actuator and II' the amplitude in dB at the point P as a function of the frequency F in kHz. A non-propagative frequency range between 0 and $f1'=2.9$ kHz, and an amplitude opposite the centre of the actuator about 30 dB higher than in areas away from the actuator, are observed.

Figure 4:
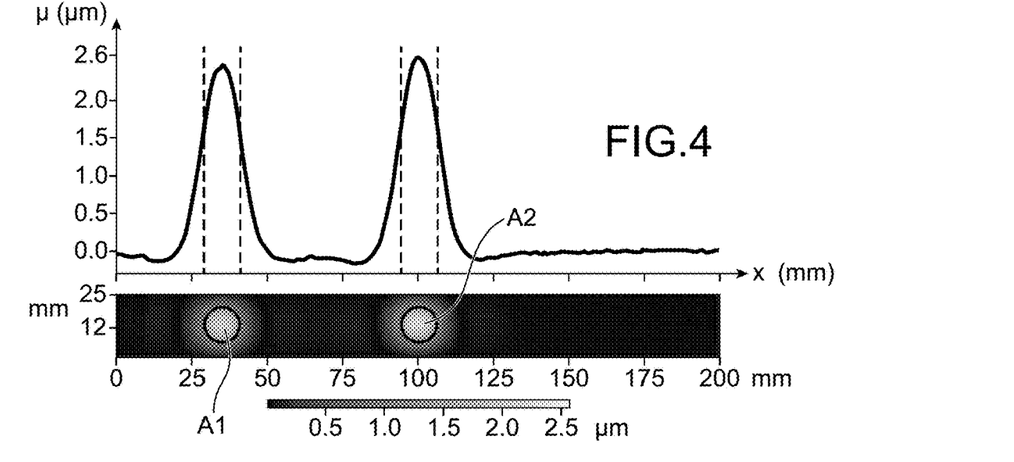
FIG. 4 is a graphical representation of the movement in μm of the plate along the X axis for another example of a haptic interface including two actuators.

In FIG. 4, one could see the variation of the amplitude u of the movement in µm measured through the plate as a function of the position x in mm along the direction X when exciting two actuators A1, A2 at frequencies lower than f1. It is noticed that only the areas opposite the actuators are substantially moved (amplitude of 2.6 µm) so as to generate a vibrotactile feedback to the user, while the rest of the touch surface is almost immovable. Hence, a multitouch and/or multiuser use is made possible thanks to the invention.

Figure 5:
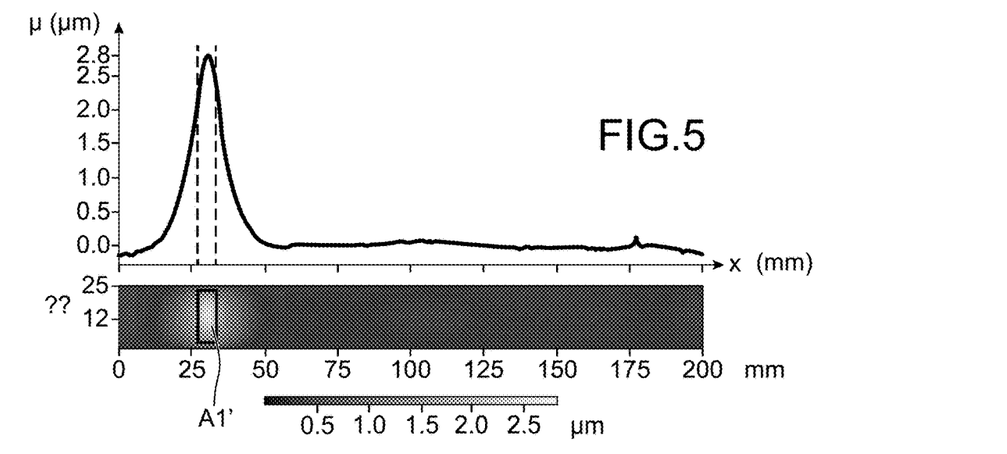
FIGS. 5 and 6 are graphical representations of the movement in μm of the plate along the X axis for two examples of a haptic interface including a rectangular shaped piezo-electric actuator and an eccentric mass actuator, respectively.

In FIG. 5, one could see the variation of the amplitude u of the movement in µm as a function of the position x in mm along the direction X for a haptic interface including a rectangular shaped piezoelectric actuator A1' with the dimensions $18\times6\times0.25$ mm$^3$, the largest sides being parallel to the direction Y.

Figure 6:
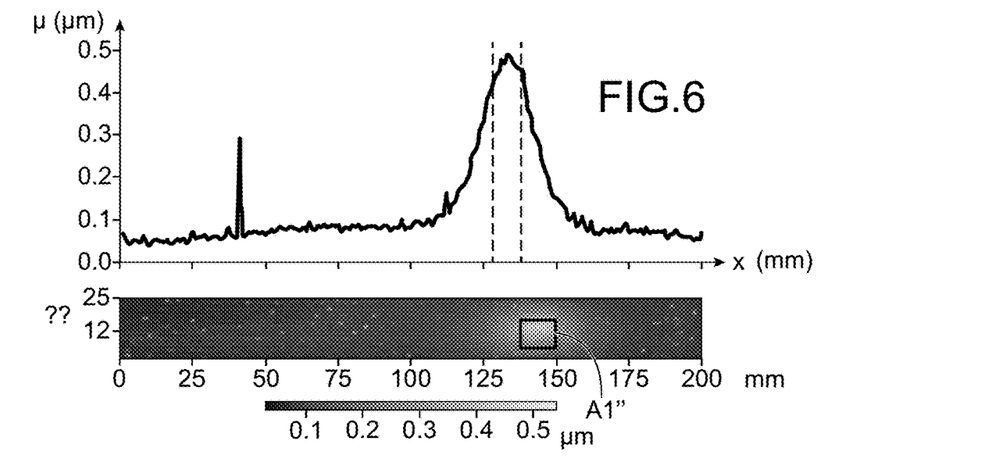

In FIG. 6, one could see the variation of the amplitude u of the movement in µm as a function of the position x in mm along the direction X for a haptic interface including an eccentric mass actuator A1" having a surface 6 for interaction with the plate of $10\times10$ mm$^2$.

Notice the location of the vibrotactile feedback at the area opposite the actuator.

The control signals may consist of a direct voltage in the case of eccentric mass actuators, a sinusoid at the resonance frequency of an actuator of the LRA-type resonant actuators or an arbitrary signal with a bandwidth lower than the cutoff frequency of the first mode in the case of electromagnetic or piezoelectric actuators.

The accuracy of the localisation of the vibrotactile feedback may be set by selecting the dimensions of the actuators, the dimensions of the plate, in particular the width of the plate and its material. The inventors have noticed that the speed at which the vibrations wane around the actuator was inversely proportional to the width of the plate. The smaller the actuators, the smaller the area where the vibrations will be generated will be.

Advantageously, the interface may include detection means 13 to detect the position of the finger(s) and/or means 15 for measuring the force exerted thereby on the surface. Thus, it is possible to modulate the vibrotactile feedback according to the position of the fingers or to the forces exerted on the surface. The vibrotactile feedback may then be activated only when the presence of a finger in contact with the touch surface opposite an actuator is detected, then resulting in a reduction of the energy consumed to make the touch interface operate.

It should be understood that a finger could come into contact with several actuators depending on the size of these and that these could be controlled to produce the same haptic feedback. For example, in FIGS. 7A and 8A, the actuators are very narrow, it is therefore likely that the fingertip of a finger covers at least two actuators. Alternatively, it is possible to consider on the contrary that they generate different vibrotactile feedbacks.

Advantageously, it is possible to combine the generation of a low-frequency vibrotactile feedback according to the invention, for example to simulate a click, and a friction modulation to simulate a texture using non-radiating frequencies which are ultrasonic frequencies, as described in the document C. Hudin, "*Local friction modulation using non-radiating ultrasonic vibrations,*" in *IEEE World Haptics Conference*, Fürstenfeldbruck (Munich), Germany, 2017. The control module then generates complex control signals combining low-frequency signals and signals at non-radiating frequency.

Furthermore, in the case where vibrations are also generated to simulate a texture, monitoring the movement of the finger advantageously allows creating an illusion of a texture finer than the dimension of the actuator itself.

According to one embodiment, the detection of the presence of a finger could be obtained by capacitive means. The finger and the upper electrode of the actuator form the two electrodes of a planar capacitor separated by an intermediate insulating plate. Furthermore, it is possible to use these means to monitor the movement of the fingers.

According to another example, the detection of the presence of a finger may be achieved by measuring a variation of the electrical impedance of the piezoelectric material of the actuator. This detection is merely accurate but is nevertheless sufficient to implement the present invention.

Alternatively, several actuators are implemented at a vibrotactile feedback area, for example to generate a vibrotactile feedback with a higher amplitude.

Figure 7A:
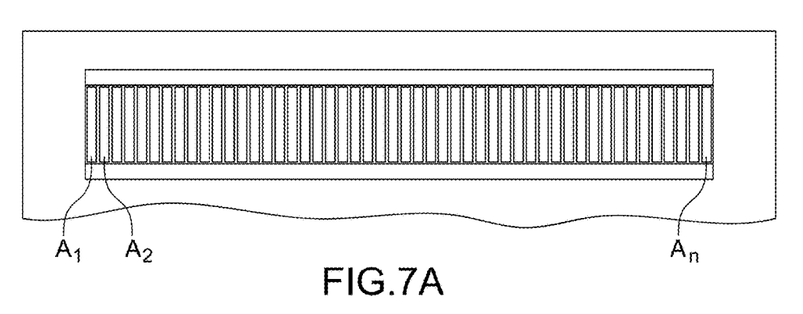
FIGS. 7A and 7B are top and side views, respectively, of an example of a haptic interface including a plurality of rectangular shaped actuators.
Figure 7B:
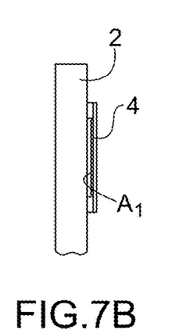

In FIGS. 7A and 7B, one could see another embodiment of a haptic interface with vibrotactile feedback including a plurality of piezoelectric actuators A1, A2 . . . An with a rectangular shape whose length is aligned with the Y axis.

In FIG. 7B, one could see the plate 4 supported by the frame 2.

Figure 8A:
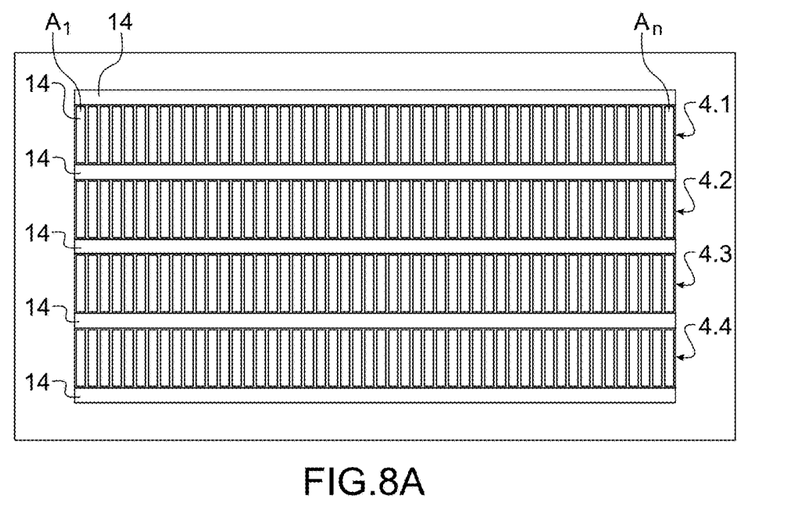
FIGS. 8A and 8B are top and side views, respectively, of an example of a two-dimensional haptic interface.
Figure 8B:
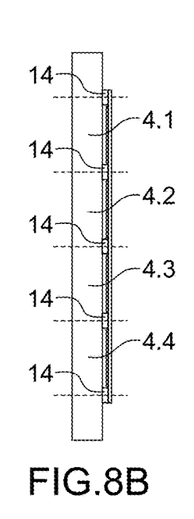

In FIGS. 8A and 8B, one could see an embodiment of a two-dimensional haptic interface including a plate 4 with indentations so as to delimit juxtaposed narrow strips 4.1, 4.2, 4.3, 4.4. The plate is then split into several waveguides.

As shown in FIG. 8B, the lateral edges of each strip are supported by the frame. In this example, the frame includes linear projections 14 along the direction Z, extending in the direction X each supporting two lateral edges of two adjacent plates. Alternatively, the frame includes as many linear projections as there are lateral edges to be supported.

Because of the embedded arrangement, the vibration cannot propagate from one strip to another.

Alternatively, the interface includes several juxtaposed narrow plates, each plate being mechanically independent of the other plates and being supported by its lateral edges. In this variant, the contact surface is not continuous between the different plates.

The user(s) can interact with several plates and at several locations of the plate simultaneously.

Figure 9:
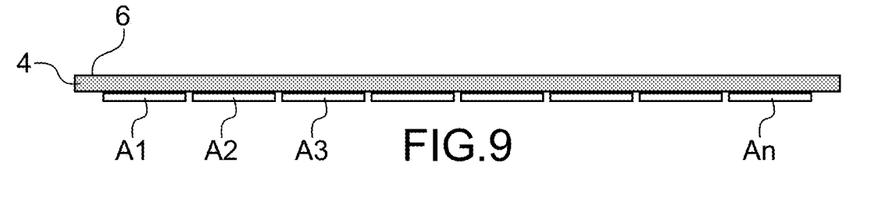
FIGS. 9, 10, 11 and 12 are side views of different stacking examples of a haptic interface.
Figure 10:
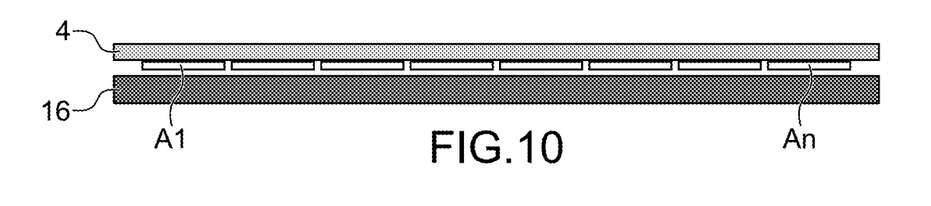
Figure 11:
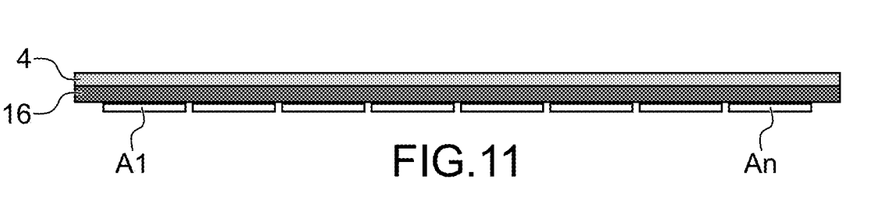

In FIGS. 9 to 11, one could see side views of different stacking examples for a haptic interface according to the invention.

In FIG. 9, one could see an embodiment of a touchpad. The plate 4 forming the touch surface is not transparent. The actuators A1 . . . An are located directly beneath the plate.

In FIGS. 10 and 11, a screen is associated to the haptic interface for example to display icons at the locations of the actuators and/or any other visuals corresponding to the message to be transmitted by vibrotactile stimulation, for example a start/stop button associated to a click or a sound bar associated to detents.

In FIG. 10, the application consists of a touchscreen. In this example, a set similar to that of FIG. 9 is disposed on a screen 16. The plate 4 and the actuators A1, . . . An are made so as to be transparent. For example, for the actuators, these consist of piezoelectric actuators deposited in a thin layer over the second face of the plate 4.

In FIG. 11, the screen 16 is fastened to the second face of the plate 4 which is transparent, and the actuators are located beneath the screen opposite to the plate and to which they apply the vibrations. The screen 16 deforms and transmits the vibrations to the plate. In this example, the actuators A1 . . . An could be non-transparent. For examples, transparent assembly glues are used to support the plate, these glues are called OCA (Optically Clear Adhesive).

The plates remain mechanically independent of each other so as not to modify the propagation modes and so that the frequency(ies) selected for the control signals actually generate evanescent waves.

In the examples of FIGS. 9, 10 and 11, the piezoelectric actuators are independent of each other, the piezoelectric materials being deposited in a discrete manner.

Figure 12:
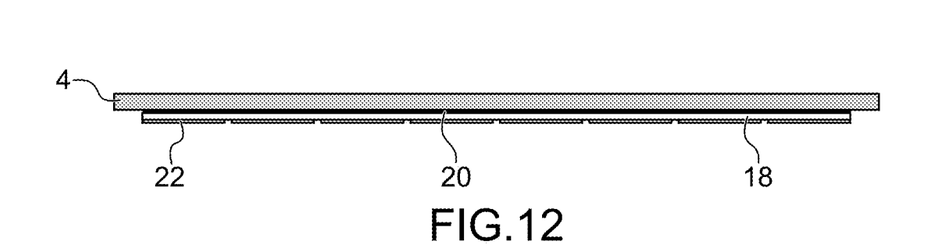

Alternatively, in FIG. 12, the piezoelectric actuators include a piezoelectric material layer 18 common to all actuators, a common electrode 20 covering a face of the piezoelectric material 18 and a plurality of electrodes 22 formed on the other face of the layer 18 and each defining actuators.

For example, the control module includes a database of vibrotactile patterns that each actuator could generate. All or part of the actuators could still generate either the same pattern or generate different patterns, for example according to a display and/or external signals, such as the force exerted by the user, the speed of movement of the finger over the surface . . . . This may be the case when the haptic interface according to the invention is used to make control bars for programmable computers, located for example in the upper portion of the keyboard offering a vibrotactile haptic feedback, for example to simulate clicks, to which a texture simulation by ultrasonic lubrication as described hereinabove is advantageously associated. The vibrotactile patterns evolve according to the display.

The haptic interface may be implemented in a mouse for computer, for example instead of the scroll wheel. The haptic interface may form a touchpad that enables scrolling with a vibrotactile feedback. Thanks to the invention, the haptic feedback is enriched in comparison with the devices of the prior art, indeed it allows simulating the click and simulating the scrolling by simulating a texture.

The haptic interface according to the invention may be applied to a device for psychophysical tests, for example on tactile perception thresholds.

The device according to the invention also has the advantage of not being limited in size, it could be manufactured over a wide range of dimensions, it could be used to make a finger-scale device, such as a computer mouse or even a multitouch and multiuser touch surface.

The invention claimed is:

1. A haptic interface comprising:
a support;
at least one plate comprising a first face forming a surface for interaction with at least one member of a user; and
at least one actuator adapted to apply a vibration to said plate; and
a control module of said actuator,
wherein said support includes at least two support elements supporting the plate so as to delimit between the two support elements a strip extending along a first direction,
wherein said actuator is located opposite to the plate with respect to the interaction surface, and
wherein said control module being configured to generate control signals to said actuator at first frequencies lower than a cutoff frequency of a first propagation mode of said plate, so that the actuator generates evanescent waves in the plate.

2. The haptic interface according to claim 1, wherein the plate has a first dimension in the first direction and wherein a distance between the two support elements is at least twice smaller than the first dimension.

3. The haptic interface according to claim 2, wherein the plate has a second dimension in a direction orthogonal to the first direction between its lateral edges, and wherein the support elements support the lateral edges, the first dimension being at least twice larger than the second dimension.

4. The haptic interface according to claim 1, wherein the plate is simply supported by the support and/or embedded to the support.

5. The haptic interface according to claim 1, wherein the plate is glued on the support.

6. The haptic interface according to claim 1, wherein the frequency(ies) of the control signals are comprised between 0 Hz and 10 kHz.

7. The haptic interface according to claim 1, including at least two actuators distributed along the first direction.

8. The haptic interface according to claim 1, wherein the support includes at least three support elements so as to delimit at least two strips in the plate in the first direction, and wherein at least one actuator is located opposite each strip.

9. The haptic interface according to claim 1, including detection means to detect a position of said at least one member and wherein the control module is configured so as to generate the control signals while taking into account the signals emitted by the detection means.

10. The haptic interface according to claim 1, including measuring means to measure a force exerted by said at least one member on the interaction surface and wherein the control module is configured so as to generate the control signals while taking into account the signals emitted by the measuring means.

11. The haptic interface according to claim 1 including several actuators and wherein the control module is configured to generate control signals for each actuator individually.

12. The haptic interface according to claim 1, wherein the control module is configured so as to generate control signals combining the control signals at the first frequencies and control signals at second non-radiating frequencies.

13. The haptic interface according to claim 1, including a screen disposed beneath the plate opposite to the interaction surface, said at least one actuator being between the plate and the screen, said at least one actuator being a piezoelectric actuator including transparent thin films.

14. The haptic interface according to claim 1, including a screen fastened to the plate opposite to the interaction surface, said screen being interposed between the plate and said at least one actuator.

15. A computer keyboard including keys and at least one haptic interface according to claim 1.

16. A computer mouse including at least one haptic interface according to claim 1, said haptic interface being configured to simulate at least one click.

\* \* \* \* \*